(12) United States Patent
Ma

(10) Patent No.: US 9,071,235 B2
(45) Date of Patent: Jun. 30, 2015

(54) APPARATUSES AND METHODS FOR CHANGING SIGNAL PATH DELAY OF A SIGNAL PATH RESPONSIVE TO CHANGES IN POWER

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/058,114

(22) Filed: Oct. 18, 2013

(65) Prior Publication Data

US 2015/0109042 A1 Apr. 23, 2015

(51) Int. Cl.
*H03H 11/26* (2006.01)
*H03K 5/14* (2014.01)

(52) U.S. Cl.
CPC .......................................... *H03K 5/14* (2013.01)

(58) Field of Classification Search
USPC .................. 327/261–264, 269, 270, 276–278
See application file for complete search history.

(56) References Cited

U.S. PATENT DOCUMENTS

| | | | | |
|---|---|---|---|---|
| 5,434,525 A | * | 7/1995 | Leonowich | 327/278 |
| 6,337,590 B1 | * | 1/2002 | Millar | 327/158 |
| 6,559,727 B2 | * | 5/2003 | Boerstler | 331/57 |
| 7,111,185 B2 | | 9/2006 | Gomm et al. | |
| 7,411,464 B1 | * | 8/2008 | Hoang et al. | 331/57 |
| 7,411,852 B2 | | 8/2008 | Nishioka et al. | |
| 7,443,216 B2 | | 10/2008 | Gomm et al. | |
| 7,715,260 B1 | | 5/2010 | Kuo et al. | |
| 7,724,036 B2 | * | 5/2010 | Das | 326/93 |
| 7,786,784 B2 | * | 8/2010 | Asano | 327/276 |
| 7,835,673 B2 | * | 11/2010 | Hosokawa et al. | 399/258 |
| 7,945,800 B2 | | 5/2011 | Gomm et al. | |
| 2005/0182983 A1 | | 8/2005 | Gaskins et al. | |
| 2009/0160520 A1 | * | 6/2009 | Matsunami | 327/276 |
| 2010/0090730 A1 | | 4/2010 | Wu | |
| 2011/0204963 A1 | | 8/2011 | Kim | |
| 2012/0182057 A1 | * | 7/2012 | Ma et al. | 327/276 |
| 2013/0051166 A1 | | 2/2013 | Ma et al. | |
| 2014/0240013 A1 | | 8/2014 | Ma et al. | |

FOREIGN PATENT DOCUMENTS

CN 101752009 A 6/2010

* cited by examiner

*Primary Examiner* — Brandon S Cole
(74) *Attorney, Agent, or Firm* — Dorsey & Whitney LLP

(57) ABSTRACT

Apparatuses and methods for changing a signal path delay of a signal path responsive to changes in power provided to the signal path are disclosed. An example apparatus includes a signal path and signal path delay compensation circuit. The signal path includes a plurality of signal driver circuits coupled in series. The signal path delay compensation circuit includes an adjustable path delay circuit and a bias circuit. The adjustable path delay circuit is coupled to an output of a signal driver circuit of the plurality of signal driver circuits and includes a latch circuit. The bias circuit is configured to change a resistance to switching a latched signal level of the latch circuit responsive to changes in power provided to the signal path. Additional example apparatuses and methods are also disclosed.

26 Claims, 8 Drawing Sheets

APPARATUSES AND METHODS FOR CHANGING SIGNAL PATH DELAY OF A SIGNAL PATH RESPONSIVE TO CHANGES IN POWER

BACKGROUND

A signal path provides a signal. A signal path has a propagation delay, which adds delay to a signal as it propagates through the signal path. The circuits of the signal path may have a power supply sensitivity. That is, as the power of the power supply varies, the propagation delay of the signal path may change, for example, when power decreases, the propagation delay typically increases through the signal path, when the power increases, the propagation delay decreases through the signal path.

Understanding that the propagation delay may change due to power supply sensitivity, a system including the signal path is designed with timing margins so that the system can operate correctly despite the variation in propagation delay. Designing in the margin to accommodate power supply sensitivity of the signal path circuits may reduce overall performance of a system including the signal path. In some cases, the power supply variation may be dramatic enough that the timing margin that is designed into the system is not sufficient to manage the variation, causing the system to operate poorly, or in a worse case, operate improperly.

In other systems, a power supply regulation circuit may be included to regulate the power supply, decreasing the power supply variation seen by the circuits of the signal path. Although a power supply regulated system has some resistance to power supply variation and the impact on propagation delay, the power supply may nonetheless decrease below a minimum operating level of the power regulation circuit, resulting in the circuit being unable to provide the regulated voltage to the circuits of the signal path causing the propagation delay of the signal path to change.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
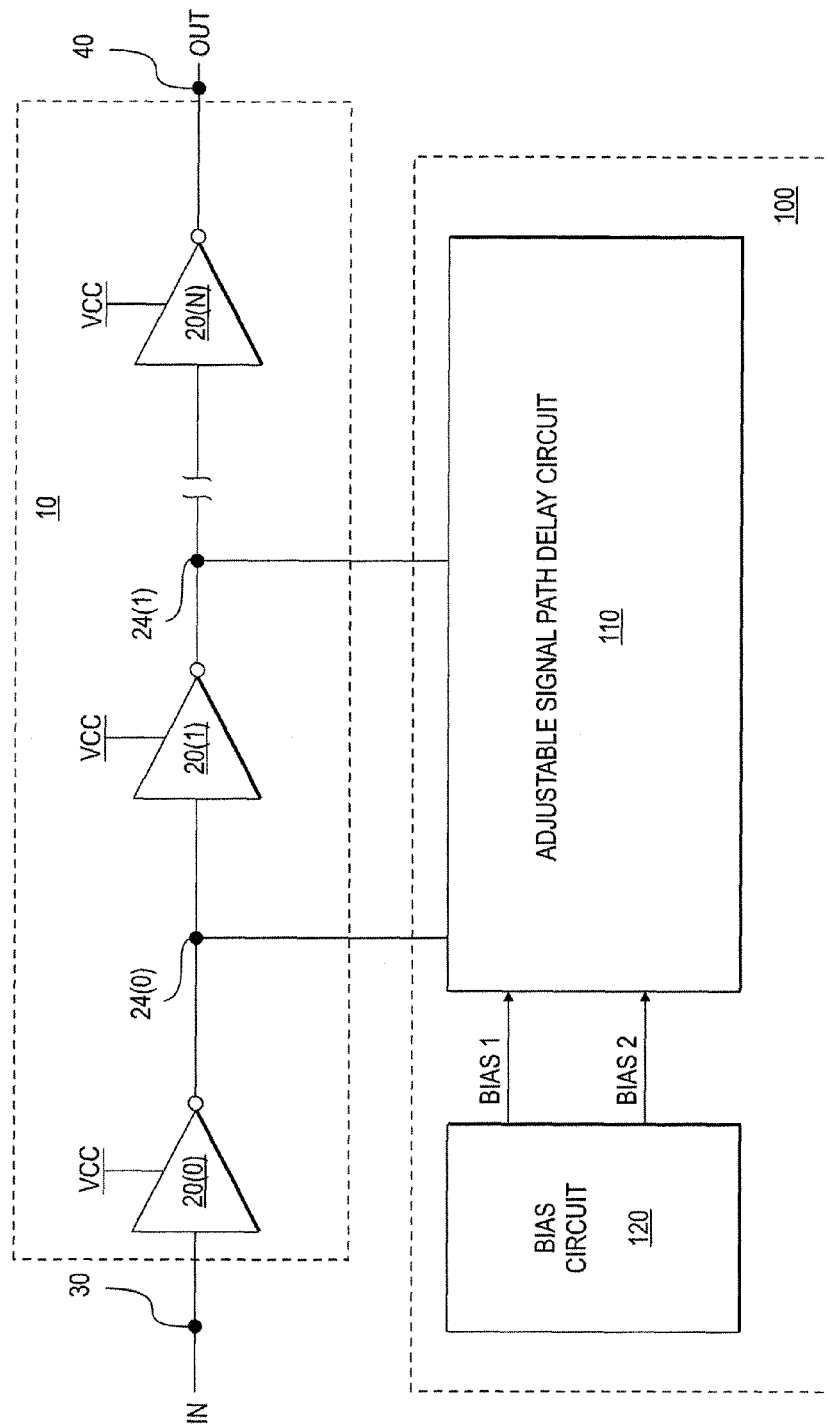
FIG. 1 is a block diagram of an apparatus that includes a signal path delay compensation circuit according to an embodiment of the invention.

FIG. 1 illustrates an apparatus that includes a signal path delay compensation circuit 100 according to an embodiment of the invention. As used herein, apparatus may refer to, for example, an integrated circuit, a memory device, a memory system, an electronic device or system, a smart phone, a tablet, a computer, a server, etc. The signal path delay compensation circuit 100 is coupled to a signal path 10. The signal path 10 includes signal driver circuits 20(0)-20(N) (N being a non-zero number) coupled in series to provide an input signal IN from an input node 30 as an output signal OUT at an output node 40. The signal driver circuit 20(0) drives a respective output signal to a node 24(0) responsive to the IN signal and the signal driver circuit 20(1) drives a respective output signal to a node 24(1) responsive to the output signal of signal driver circuit 20(0). Other signal driver circuits 20 of the signal path 10 likewise provide a respective output signal responsive to a respective input signal. The OUT signal is provided by the signal driver circuit 20(N).

The signal driver circuits 20(0)-20(N) are shown in FIG. 1 as being inverter circuits. However, signal driver circuits 20(0)-(N) other than inverter circuits may be used in other embodiments. The signal path 10 may be used to provide the IN signal from a circuit to another circuit as the OUT signal. The signal path 10 has a signal path delay resulting from a propagation delay of the signal driver circuits 20(0)-(N). The signal driver circuits 20(0)-(N) are provided power by a power supply, shown in FIG. 1 as VCC. As known, changes in the power provided to the signal driver circuits 20(0)-(N) may change the performance of the signal driver circuits, for example, cause the signal driver circuits to drive the IN signal through the signal path 10 more "slowly" or more "quickly," which in turn changes the signal path delay of the signal path 10. As will be described in more detail below, the signal path delay compensation circuit 100 is configured to compensate for changes in the signal path delay of the signal path 10 due to changes in the power.

The signal path delay compensation circuit 100 includes an adjustable signal path delay circuit 110 that is coupled to the signal path 10, and further includes a bias circuit 120. The adjustable signal path delay circuit 110 is configured to change the signal path delay of the signal path 10, for example, increasing the signal path delay and decreasing the signal path delay of the signal path 10. The bias circuit 120 is configured to provide a bias signal, or bias signals, for example, BIAS1 and BIAS2 as shown in FIG. 1, to the adjustable signal path delay circuit 110. The BIAS1 and BIAS2 signals are based at least in part on the power provided by a power supply, and are provided to the adjustable signal path delay circuit 110 to change the signal path delay based on the BIAS1 and BIAS2 signals. As a result, the signal path delay may be changed based on the power provided by the power supply.

The signal path delay may be changed by the signal path delay compensation circuit 100 to compensate for changes of the signal path delay due to changing power provided to the signal driver circuits 20 of the signal path 10. For example, the signal path delay compensation circuit 100 may reduce signal path delay when the power provided by the power supply decreases and may increase signal path delay when the power provided by the power supply increases. Typically, decreasing power typically results in increasing signal path delay. The decrease in signal path delay caused by the signal path delay compensation circuit 100 may compensate for the increase in signal path delay due to decreasing power. Similarly, increasing power typically results in decreasing signal path delay. The increase in signal path delay caused by the signal path delay compensation circuit 100 may compensate for the decrease in signal path delay due to increasing power.

Figure 2:
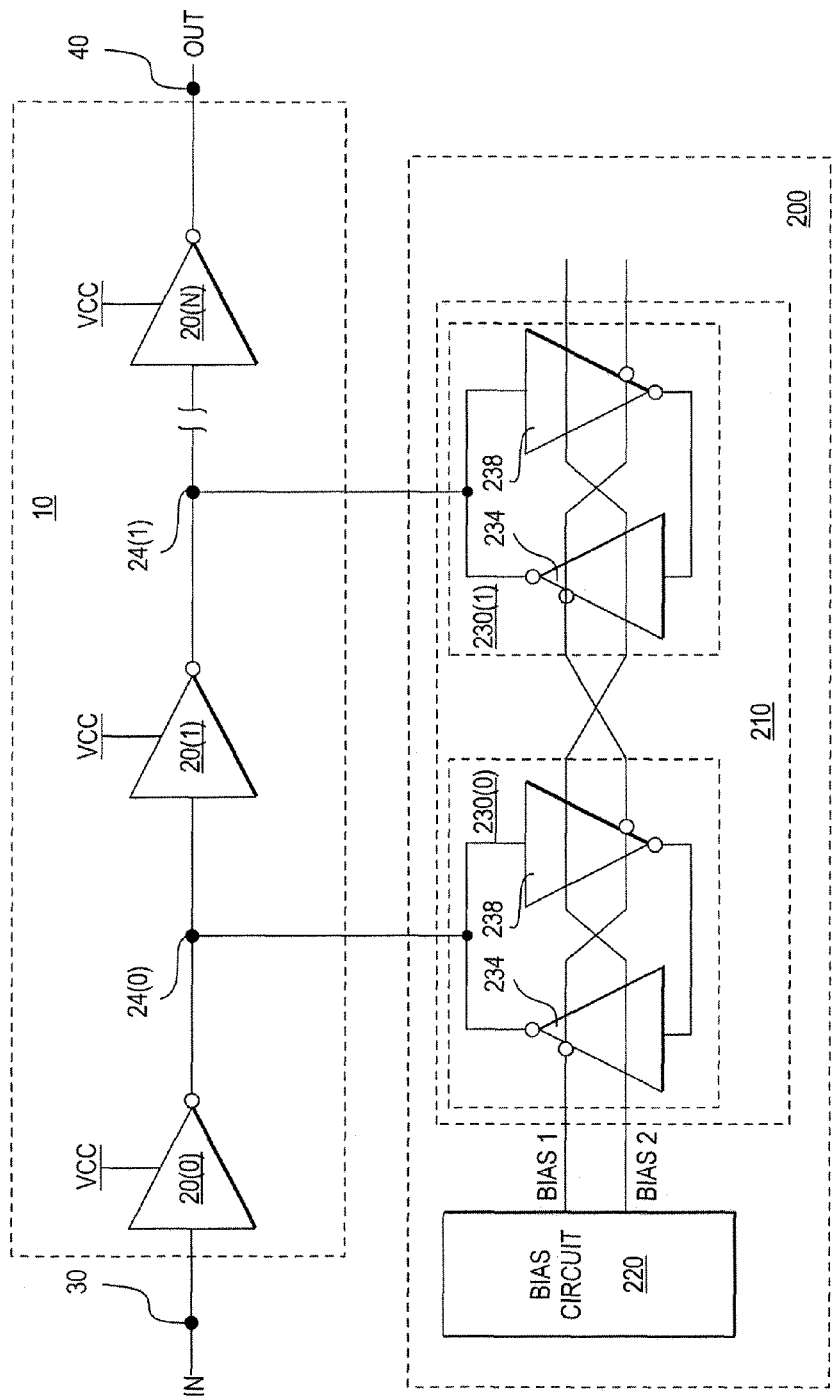
FIG. 2 is a is a block diagram of an apparatus that includes a signal path delay compensation circuit according to an embodiment of the invention.

FIG. 2 illustrates a signal path delay compensation circuit 200 according to an embodiment of the invention coupled to a signal path 10. The signal path 10 was previously described with reference to FIG. 1. The signal path delay compensation circuit 200 may be used for the signal path delay compensation circuit 100 of FIG. 1. The signal path delay compensation circuit 200 includes an adjustable signal path delay circuit 210 and a bias circuit 220. The adjustable signal path delay circuit 210 includes adjustable path delay circuits 230(0) and 230(1) coupled to the signal path 10 at nodes 24(0) and 24(1), respectively. Although two adjustable path delay circuits 230 are shown in the embodiment of FIG. 2, other embodiments may include fewer or greater adjustable path delay circuits. In some embodiments, an adjustable path delay circuit is coupled to outputs of the signal driver circuits 20 of a signal path, except for a last signal driver circuit which provides the OUT signal. In some embodiments, an adjustable path delay circuit is coupled to outputs of some of the signal driver circuits 20 of a signal path.

The adjustable path delay circuits 230(0) and 230(1) are provided bias signals BIAS1 and BIAS2 from the bias circuit 220. In some embodiments, bias circuit 220 may be configured to provide a BIAS1 signal having an inverse relationship with power and provide a BIAS2 signal having a direct relationship with power. For example, as the power increases, the BIAS1 signal decreases and the BIAS2 signal increases, and as the power decreases, the BIAS1 signal increases and the BIAS2 signal decreases.

In the embodiment of FIG. 2, an adjustable path delay circuit 230 is configured to change the signal path delay of the signal path 10 based on the BIAS1 and BIAS2 signals. The adjustable path delay circuits 230 includes driver circuits 234 and 238, both of which are provided the BIAS1 and BIAS2 signals. The driver circuits 234 and 238 are shown in FIG. 2 as being inverter circuits. However, driver circuits other than inverter circuits may be used in some embodiments. The driver circuits 234 and 238 may be configured to have adjustable drivability, which is changed based on the BIAS1 and BIAS2 signals. The driver circuits 234 and 238 are coupled as a latch circuit, for example, cross-coupled inverter circuits, that latches the signal level at the node to which the adjustable path delay circuit 230 is coupled. For example, the driver circuit 230(0) coupled to the output of the signal driver circuit 20(0) latches the signal level at the node 24(0) and the driver circuit 230(1) coupled to the output of the signal driver circuit 20(1) latches the signal level at the node 24(1).

As the BIAS1 and BIAS2 signals change, for example, based on changing power VCC, the drivability of driver circuits 234 and 238 changes. For example, as the BIAS1 signal decreases and the BIAS2 signal increases, which may occur when the power provided by the power supply increases, the driver circuits 234 and 238 may have increased drivability. In contrast, as the BIAS1 signal increases and the BIAS2 signal decreases, which may occur when the power provided by the power supply decreases, the driver circuits 234 and 238 may have decreased drivability. Increased drivability causes the latch circuit of the driver circuits 234 and 238 to be more resistant to switching its latched signal level, and decreased drivability causes the latch circuit of the driver circuits 234 and 238 to be less resistant to switching its latched signal level. The drivers 234 and 238 of the adjustable path delay circuit 230 may be configured to have weaker drivability than that of the signal driver circuit 20 to which the adjustable path delay circuit is coupled so that the signal driver circuit 20 may sufficiently drive a signal transition to switch the signal level latched by the adjustable path delay circuit 230. For example, the driver circuits 234 and 238 of an adjustable path delay circuit 230 may have a maximum drivability when controlled by the BIAS1 and BIAS2 signals that nonetheless allows the signal driver circuit 20 to provide a signal that can switch between high and low signal levels.

In operation, the signal path delay of the signal path 10 may be changed by the adjustable path delay circuits 230 responsive to changes in power provided to the signal path 10. The BIAS1 and BIAS2 signals may reflect the changes in power. Assuming a decrease in power provided to the signal path 10, which typically results in an increase in signal path delay, the drivability of the driver circuits 234 and 238 of the adjustable path delay circuits 230 may decrease based on the BIAS1 and BIAS2 signals. Due to the decreased drivability of the driver circuits 234 and 238 (resulting in the latch circuit being less resistant to switching a latched signal level), it is relatively easier for a signal driver circuit 20 to drive a respective output signal as the output signal transitions between high and low signal levels. For example, as the drivability of the driver circuits 234 and 238 of the adjustable path delay circuit 230(0) decreases, it is relatively easier for the signal driver circuit 20(0) to drive a signal at the node 24(0) that transitions from a high to low signal level, or vice versa. Likewise, it is relatively easier for the signal driver circuit 20(1) to drive a transitioning signal at the node 24(1) as the drivability of the driver circuits 234 and 238 of the adjustable path delay circuit 230(1) decrease as well. By making it relatively easier for the signal driver circuits 20 to drive a transitioning signal, the transition times of a signal propagating through the signal path 10 is relatively faster, that is, with less delay. In effect, the decreased drivability of the driver circuits 234 and 238 of the adjustable path delay circuits 230(0) and 230(1) decreases the delay of the signal path 10, and may compensate for the increase in signal path delay due to a decrease in power provided to the signal path 10.

Assuming an increase in power provided to the signal path 10, which typically results in a decrease in signal path delay, the drivability of the driver circuits 234 and 238 of the adjustable path delay circuits 230 may increase based on the BIAS1 and BIAS2 signals. Due to the increased drivability of the driver circuits 234 and 238 (resulting in the latch circuit being more resistant to switching a latched signal level), it is relatively harder for a signal driver circuit 20 to drive a respective output signal as the output signal transitions between high and low signal levels. For example, as the drivability of the driver circuits 234 and 238 of the adjustable path delay circuit 230(0) increases, it is relatively harder for the signal driver circuit 20(0) to drive a signal at the node 24(0) that transitions from a high to low signal level, or vice versa. It is also relatively harder for the signal driver circuit 20(1) to drive a transitioning signal at the node 24(1) as the drivability of the driver circuits 234 and 238 of the adjustable path delay circuit 230(1) increases as well. As a result of it being relatively harder for the signal driver circuits 20 to drive a transitioning signal, the transition times of a signal propagating through the signal path 10 is relatively slower, that is, with more delay. In effect, the increased drivability of the driver circuits 234 and 238 of the adjustable path delay circuits 230(0) and 230(1)

increases the delay of the signal path 10, and may compensate for the decrease in signal path delay due to an increase in power provided to the signal path 10.

Figure 3:
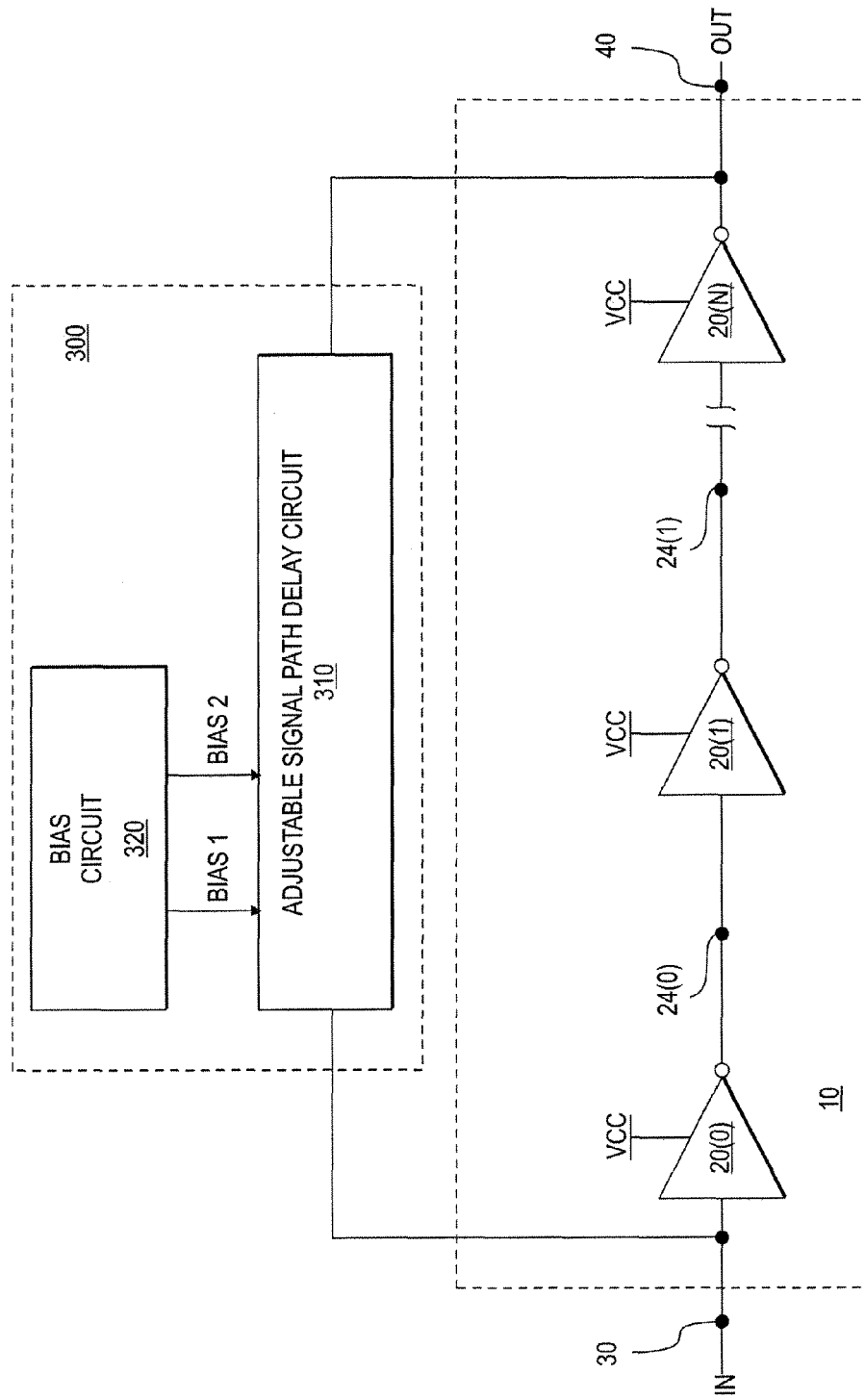
FIG. 3 is a is a block diagram of an apparatus that includes a signal path delay compensation circuit according to an embodiment of the invention.

FIG. 3 illustrates an apparatus that includes a signal path delay compensation circuit 300 according to an embodiment of the invention. The signal path delay compensation circuit 300 is coupled to a signal path 10. The signal path 10 was previously described with reference to FIG. 1. As previously described, changes in the power provided to the signal driver circuits 20(0)-(N) may change the signal path delay of the signal path 10. For example, a change in the power to the signal driver circuits 20(0)-(N) may cause the signal driver circuits to drive an input signal IN through the signal path 10 more "slowly" or more "quickly" to provide an output signal OUT, which in turn changes the signal path delay of the signal path 10. The signal path delay compensation circuit 300 may compensate for changes in the signal path delay of the signal path 10 due to changes in the power.

The signal path delay compensation circuit 300 includes an adjustable signal path delay circuit 310 that is coupled to the signal path 10, and further includes a bias circuit 320. The adjustable signal path delay circuit 310 is configured to change the signal path delay of the signal path 10, for example, increasing the signal path delay and decreasing the signal path delay of the signal path 10. The adjustable signal path delay circuit 310 provides an output signal (e.g., a "mixing signal") responsive to the IN signal that when combined with an output from a last signal driver circuit 20(N) in effect changes the signal path delay. In some embodiments, a path delay of the adjustable signal path delay circuit 310 is less than a path delay of the signal path 10.

Combining the mixing signal from the adjustable signal path delay circuit 310 mixes it with an output signal provided to the node 40, for example, by signal driver circuit 20(N). The bias circuit 320 is configured to provide a bias signal, or bias signals, for example, BIAS1 and BIAS2 as shown in FIG. 3, to the adjustable signal path delay circuit 310. The BIAS1 and BIAS2 signals may be based at least in part on the power provided by a power supply VCC. The BIAS1 and BIAS2 signals are provided to the adjustable signal path delay circuit 310 to change the signal path delay based on the BIAS1 and BIAS2 signals. As a result, the signal path delay of the signal path 10 may be changed based on the power provided by the power supply.

The signal path delay of the signal path 10 may be changed by the signal path delay compensation circuit 300 to compensate for changes of the signal path delay, for example, due to changing power provided to the signal driver circuits 20 of the signal path 10. For example, signal path delay compensation circuit 300 may reduce signal path delay when the power provided by the power supply decreases, and may increase signal path delay when the power provided by the power supply increases. As previously discussed, decreasing power typically results in increasing signal path delay. The decrease in signal path delay caused by the signal path delay compensation circuit 300 may compensate for the increase in signal path delay due to decreasing power. Similarly, increasing power typically results in decreasing signal path delay. The increase in signal path delay caused by the signal path delay compensation circuit 300 may compensate for the decrease in signal path delay due to increasing power.

Figure 4:
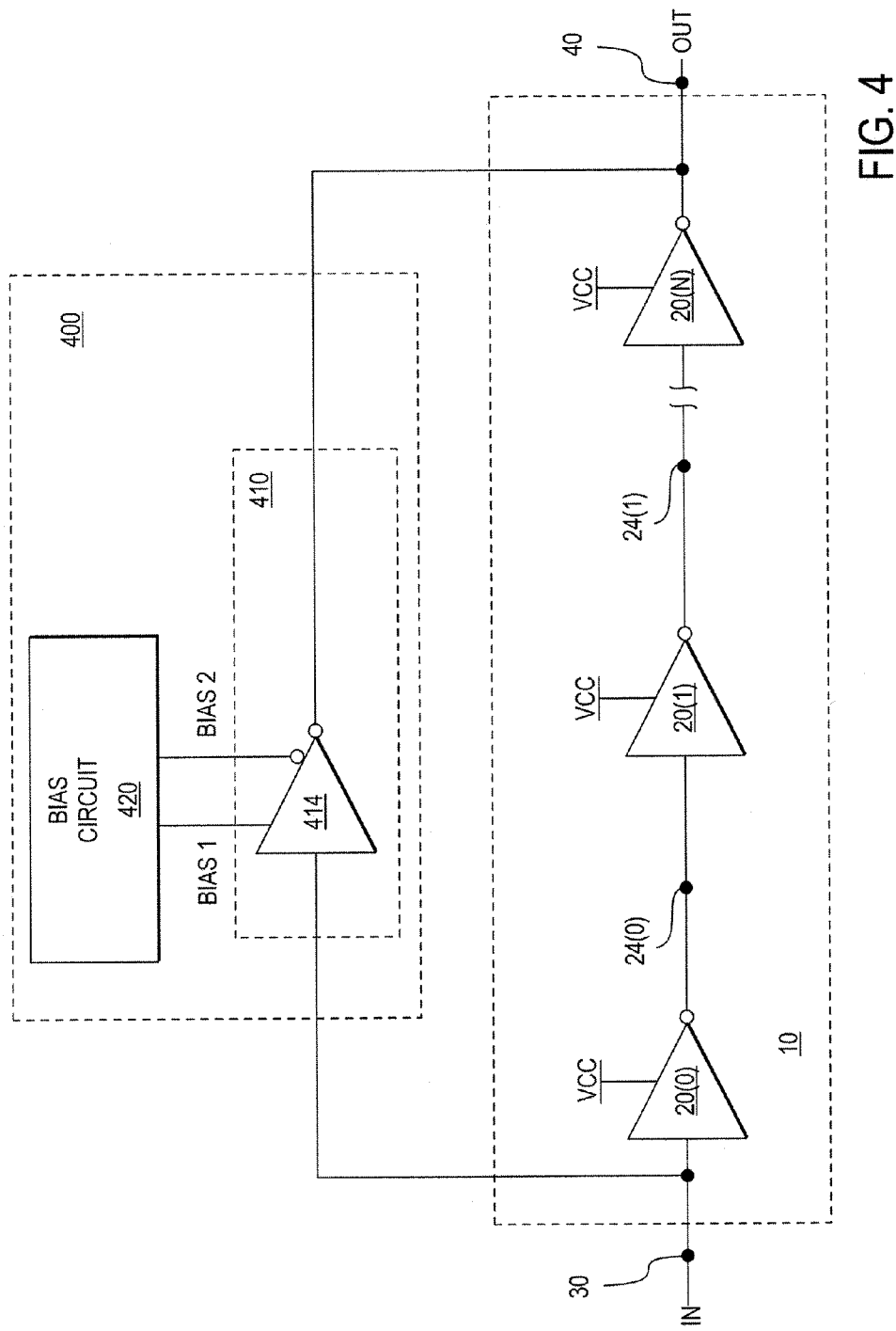
FIG. 4 is a is a block diagram of an apparatus that includes a signal path delay compensation circuit according to an embodiment of the invention.

FIG. 4 illustrates a signal path delay compensation circuit 400 according to an embodiment of the invention coupled to a signal path 10. The signal path delay compensation circuit 400 may be used for the signal path delay compensation circuit 300 of FIG. 3. The signal path delay compensation circuit 400 includes an adjustable signal path delay circuit 410 and a bias circuit 420. The adjustable signal path delay circuit 410 includes an adjustable path delay circuit 414 coupled to the signal path 10 at nodes 30 and 4Q. The adjustable signal path delay circuit 410 is configured to provide a mixing signal responsive to the IN signal that is combined with an output signal provided to node 40, for example, by signal driver circuit 20(N). Although one adjustable path delay circuit 414 is shown in the embodiment of FIG. 4, other embodiments may include a greater number adjustable path delay circuits. In some embodiments, an adjustable path delay circuit 410 is coupled to the signal path 10 at nodes other than nodes 30 and 40. For example, the adjustable signal path delay circuit 410 may be coupled to a node between two signal driver circuits 20 of the signal path. In some embodiments, a path delay of the adjustable signal path delay circuit 410 is less than that through the signal driver circuits to which the input and output of the adjustable signal path delay circuit 410 is coupled. For example, with reference to FIG. 4, the input and output of the adjustable signal path delay circuit 410 are coupled across (N+1) signal driver circuits 20(0)-20(N), and the propagation delay of the adjustable signal path delay circuit 410 is less than the path delay through the signal driver circuits 20(0)-20(N). The path delay of the adjustable path delay circuit 410 may be based on a propagation delay of the adjustable path delay circuit included in the adjustable path delay circuit.

The adjustable path delay circuit 414 is provided bias signals BIAS1 and BIAS2 from the bias circuit 220. In some embodiments, bias circuit 220 may be configured to provide a BIAS1 signal having an inverse relationship with power and provide a BIAS2 signal having a direct relationship with power. For example, as the power increases, the BIAS1 signal decreases and the BIAS2 signal increases, and as the power decreases, the BIAS1 signal increases and the BIAS2 signal decreases.

In the embodiment of FIG. 4, the adjustable path delay circuit 414 is configured to change the signal path delay of the signal path 10 based on the BIAS1 and BIAS2 signals. The adjustable path delay circuit 414 may be a driver circuit, such as an inverter, that is provided the BIAS1 and BIAS2 signals. However, driver circuits other than inverter circuits may be used without departing from the scope of the invention.

As the BIAS1 and BIAS2 signals change, for example, based on changing power VCC, the drivability of the adjustable path delay circuit 414 changes. For example, as the BIAS1 signal increases and the BIAS2 signal decreases, which may occur when the power provided by the power supply decreases, the adjustable path delay circuit 414 driver circuits 234 and 238 may have increased drivability. In contrast, as the BIAS1 signal decreases and the BIAS2 signal increases, which may occur when the power provided by the power supply increases, the adjustable path delay circuit 414 may have decreased drivability. Increased drivability causes the adjustable path delay circuit 414 to drive a signal transition between high and low signal levels faster, and decreased drivability causes the adjustable path delay circuit 414 to drive a signal transition between high and low signal levels slower. In effect, the adjustable path delay circuit 414 may be an adjustable delay circuit having an adjustable delay that can be changed based on the BIAS1 and BIAS2 signals.

In operation, the signal path delay of the signal path 10 may be changed by the adjustable path delay circuit 414 responsive to changes in power provided to the signal path 10, with the BIAS1 and BIAS2 signals reflecting the changes in power. Assuming a decrease in power provided to the signal path 10, which typically results in an increase in signal path delay, the drivability of the adjustable path delay circuit 414 may increase based on the BIAS1 and BIAS2 signals. Due to the increased drivability of the adjustable path delay circuit 414 the mixing signal provided by the adjustable path delay circuit 414 responsive to the IN signal transitions between high and low signal levels faster (e.g., lower signal transition time). The mixing signal having a lower signal transition time is combined with the signal provided to the node 40, for example, by the signal driver circuit 20(N), to provide an OUT signal having relatively faster signal transition times compared to an OUT signal not combined with the mixing signal provided by the adjustable path delay circuit 414 (which has faster signal transition times due to the increased drivability). By providing an OUT signal having relatively faster signal transition times, the signal path delay is reduced. In effect, the increased drivability of the adjustable path delay circuit 414 decreases the delay of the signal path 10, and may compensate for the increase in signal path delay due to a decrease in power provided to the signal path 10.

Assuming an increase in power provided to the signal path 10, which typically results in a decrease in signal path delay, the drivability of the adjustable path delay circuit may decrease based on the BIAS1 and BIAS2 signals. Due to the decreased drivability of the adjustable path delay circuit the mixing signal provided by the adjustable path delay circuit 414 responsive to the IN signal transitions between high and low signal levels slower (e.g., higher signal transition time). The mixing signal having the lower signal transition time is combined with the signal provided to the node 40, for example, by the signal driver circuit 20(N), to provide an OUT signal having relatively slower signal transition times compared to an OUT signal not combined with the mixing signal provided by the adjustable path delay circuit 414 (which has slower signal transition times due to the increased drivability). By providing an OUT signal having relatively slower signal transition times, the signal path delay is increased. In effect, the decreased drivability of the adjustable path delay circuit 414 increases the delay of the signal path 10, and may compensate for the decrease in signal path delay due to an increase in power provided to the signal path 10.

Figure 5:
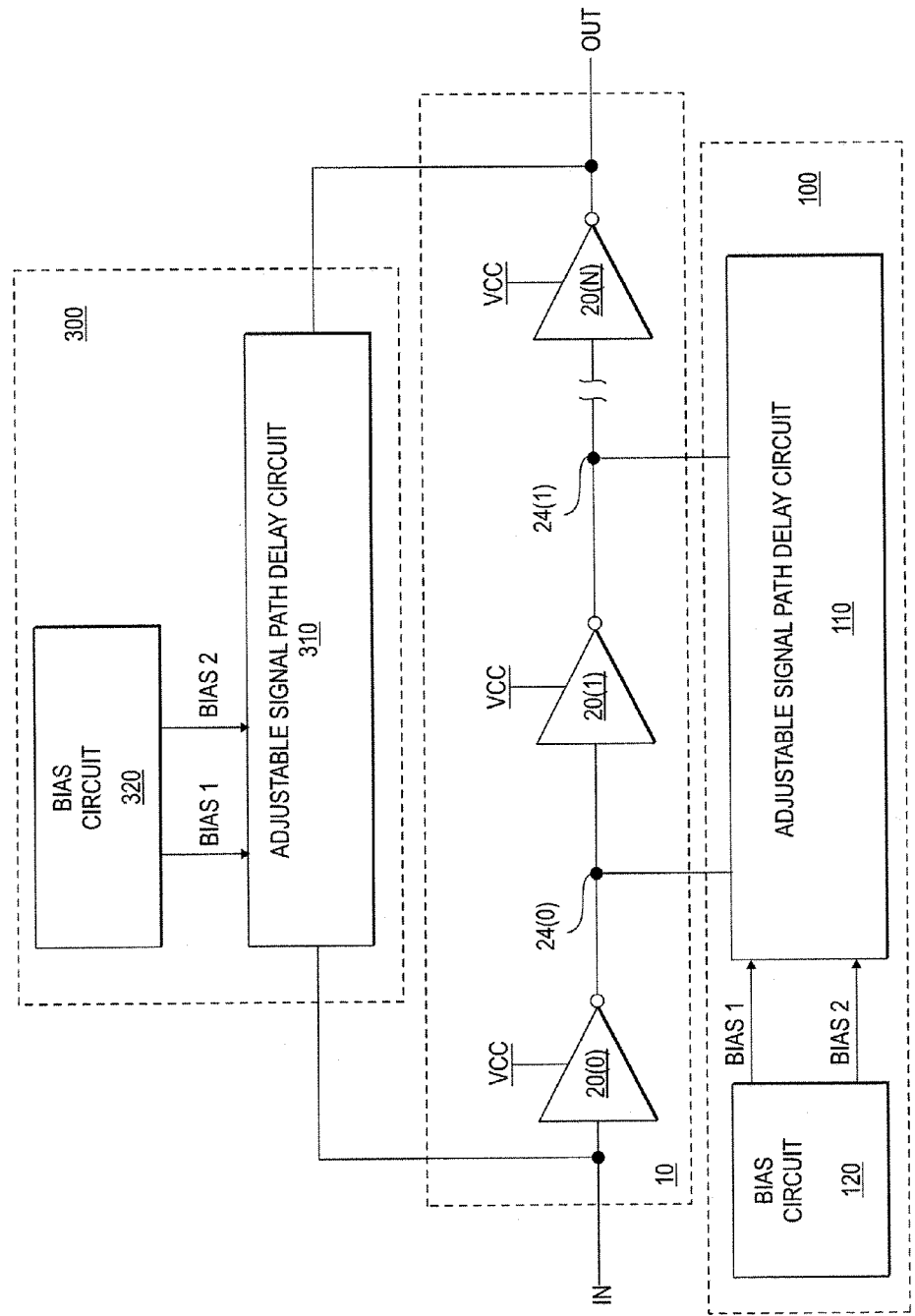
FIG. 5 is a is a block diagram of an apparatus that includes signal path delay compensation circuits according to an embodiment of the invention.

FIG. 5 illustrates an apparatus that includes signal path delay compensation circuit 100 and signal path delay compensation circuit 300. The signal path delay compensation circuit 100 and signal path delay compensation circuit 300 are coupled to a signal path 10. As previously described, the signal path delay compensation circuits 100 and 300 are configured to change a signal path delay, for example, to compensate for changes in power provided to the signal path 10. In the embodiment illustrated in FIG. 5, the signal path delay compensation circuits 100 and 300 may both change the signal path delay for changing power. The signal path delay compensation circuit 200 may be used for the signal path delay compensation circuit 100 and the signal path delay compensation circuit 400 may be used for the signal path delay compensation circuit 300.

Figure 6:
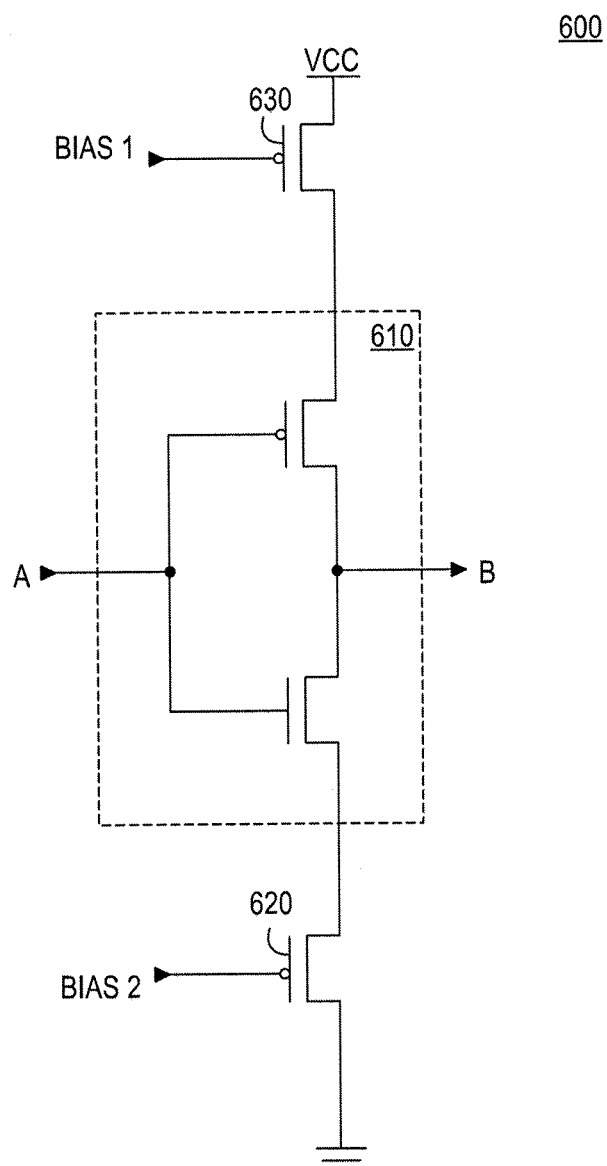
FIG. 6 is a schematic diagram of a driver circuit according to an embodiment of the invention.

FIG. 6 illustrates a driver circuit 600 according to an embodiment of the invention. The driver circuit 600 may be used for the driver circuits 234, 238, and 414 previously described with reference to FIGS. 2 and 4. The driver circuit 600 includes an inverter 610 that is configured to receive an input signal A and provide an output signal 13 that has a signal level complementary to that of the A signal. A transistor 620 is coupled to the inverter 610 and a reference voltage, for example, ground, and a transistor 630 is coupled to the inverter and a power supply, for example, VCC. The transistor 620 receives a bias signal BIAS2 and the transistor 630 receives a bias signal BIAS1. As previously discussed, the BIAS1 and BIAS2 signals may be based at least in part on the power provided by power supply VCC or a different power supply. The BIAS1 and BIAS2 signals may be used to control the drivability of the inverter 610. The drivability of the inverter 610 may be increased by decreasing the voltage of the BIAS1 signal and increasing the voltage of the BIAS2 signal, or combinations of both. The drivability may be decreased by increasing a voltage of the BIAS1 signal and decreasing a voltage of the BIAS2 signal, or combinations of the two.

Figure 7:
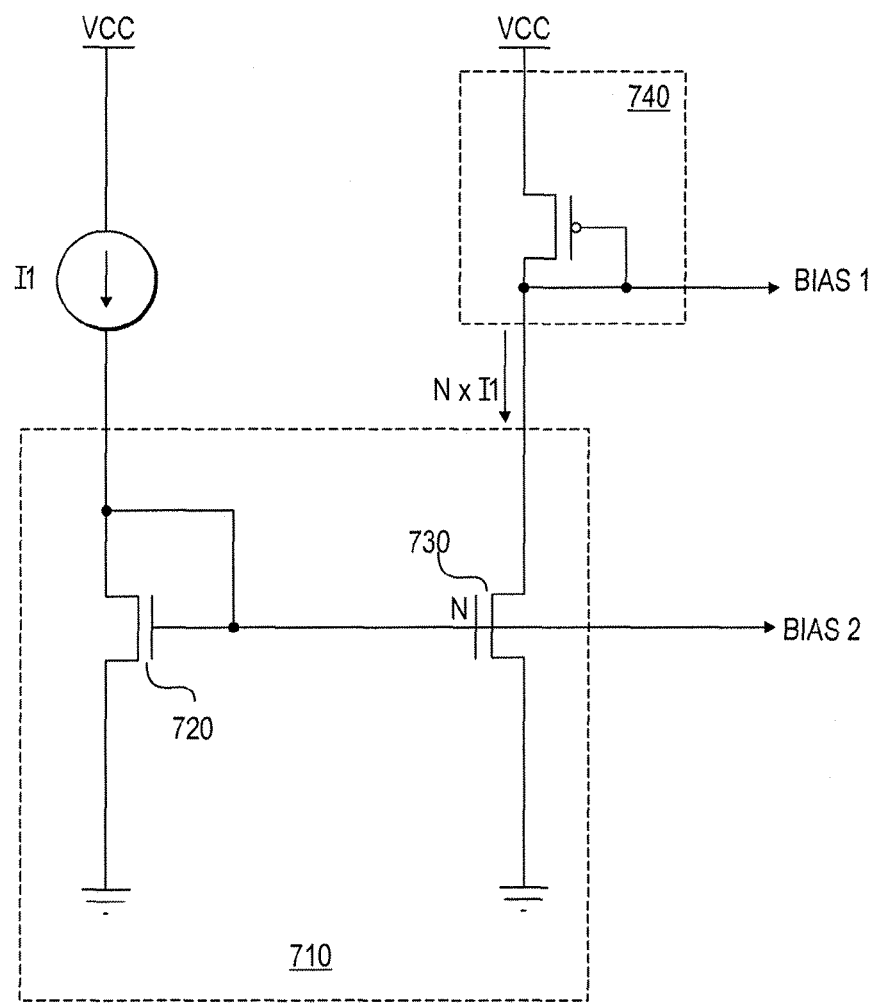
FIG. 7 is a schematic diagram of a bias circuit according to an embodiment of the invention.

FIG. 7 illustrates a bias circuit 700 according to an embodiment of the invention. The bias circuit 700 is configured to provide a BIAS1 signal having decreasing voltage and a BIAS2 signal having increasing voltage based at least in part on an increasing power supply VCC and provide a BIAS1 signal having increasing voltage and a BIAS2 signal having decreasing voltage based at least in part on a decreasing power supply VCC. The bias circuit 700 may be used for the bias circuits 120, 220, 320, and 420 of FIGS. 1-4.

The bias circuit 700 includes a current mirror 710 having transistors 720 and 730 coupled in a current mirror configuration. The transistors 720 and 730 are illustrated in FIG. 7 as n-channel transistors, however, other types of transistors may be used as well. Based at least in part on an input current I1, shown in FIG. 7 as being provided by a current source, the current mirror 710 provides an output current N*I1 which is the I1 current scaled by a factor of N. The factor N is based at least in part on the transistor characteristics of the transistor 730 relative to the transistor characteristics of the transistor 720. For example, the transistor 730 may conduct N times the current of the transistor 720 for a given gate voltage, resulting in an output current that is N times the I1 current. The BIAS2 signal is provided by the gate voltage for the transistors 720 and 730 resulting from the I1 current. A load circuit 740 is coupled to the transistor 730 to provide the BIAS1 signal. The load circuit 740 is illustrated in FIG. 7 as a diode coupled p-channel transistor, however, other load circuits may be used as well.

In operation, the I1 current may be based at least in part on a power supply, for example, VCC as illustrated in FIG. 7. Typically, as the power supply increases the resulting I1 increases, and as the power supply decreases, the resulting I1 decreases. In the case of an increasing I1 current, the BIAS2 voltage increases as the gate voltages for the transistors 720 and 730 increases. The output current provided by the transistor 730 also increases, which in turn decreases the BIAS1 voltage provided by the load circuit 740. As a result, the voltage of the BIAS2 signal increases and the voltage of the BIAS1 signal decreases with an increasing power supply. Likewise, the voltage of the BIAS2 signal decreases and the voltage of the BIAS1 voltage increases with a decreasing power supply (i.e., decreasing I1 current).

Figure 8:
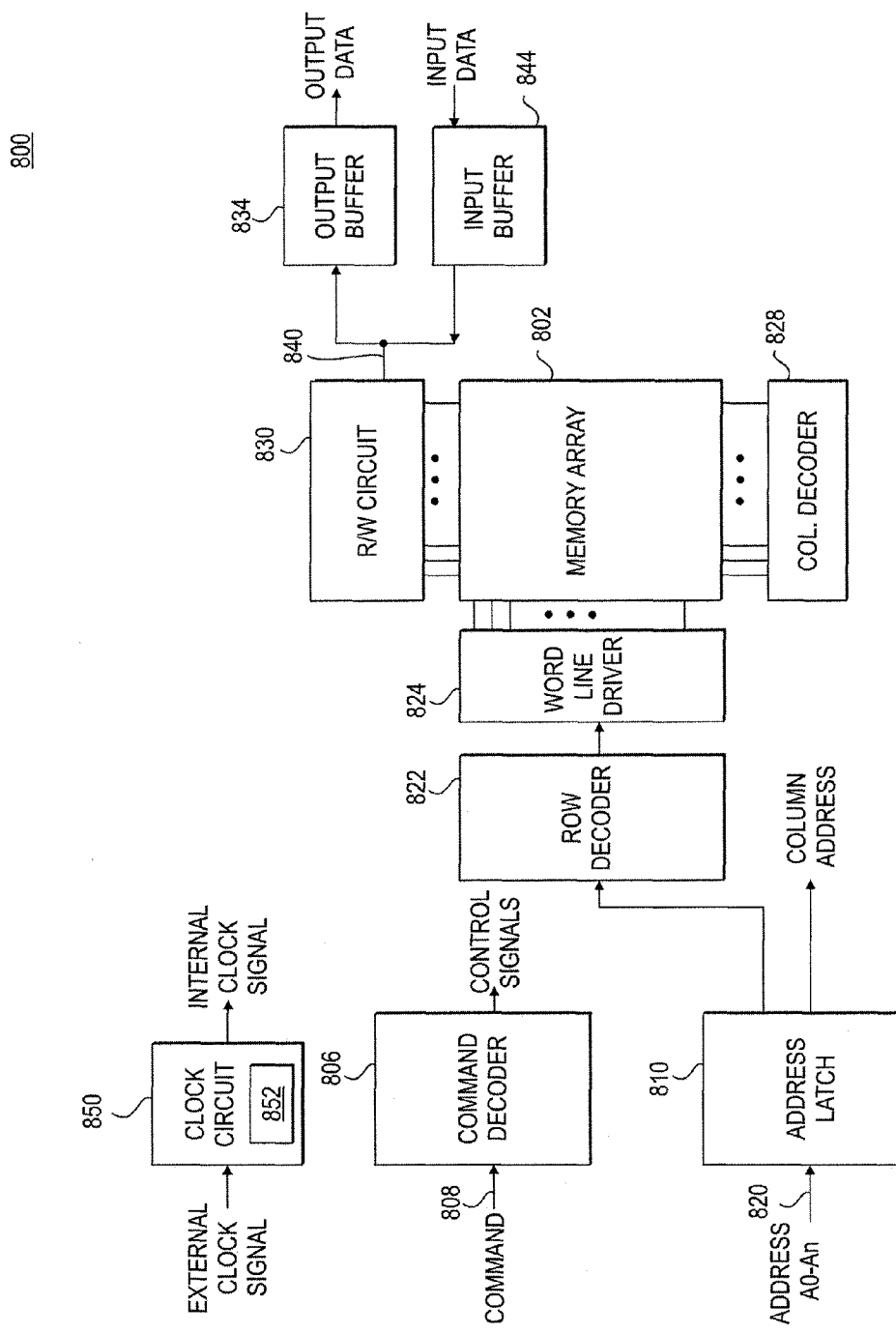
FIG. 8 is a block diagram of a memory including a signal path delay compensation circuit according to an embodiment of the invention.

FIG. 8 illustrates a memory 800 including a signal path delay compensation circuit according to an embodiment of the invention. The memory 500 includes an array 502 of memory cells, which may be, for example, volatile memory cells (e.g., DRAM memory cells, SRAM memory cells), non-volatile memory cells (e.g., flash memory cells), or some other types of memory cells. The memory system 800 includes a command decoder 806 that receives memory commands through a command bus 808 and generates corresponding control signals within the memory system 800 to carry out various memory operations. The command decoder 806 responds to memory commands applied to the command bus 808 to perform various operations on the memory array 802. For example, the command decoder 806 is used to generate internal control signals to read data from and write data to the memory array 802. Row and column address signals are applied to the memory system 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output buffer 834 via an input-output data bus 840. Write data are applied to the memory array 802 through a data input buffer 844 and the memory array read/write circuitry 830.

A clock circuit 850 may include a signal path and a signal path delay compensation circuit 852 according to an embodiment of the invention. The signal path may provide an internal clock signal responsive to an external clock signal, and include signal driver circuits that may have power supply sensitivity, for example, have propagation delays that are affected by changing power supply. The signal path delay compensation circuit 852 may compensate for the change in signal path propagation delay due to changing power supply, as disclosed.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a signal path having a signal path delay and configured to propagate an input signal therethrough and provide an output signal having the signal path delay relative to the input signal;
   an adjustable path delay circuit coupled to the signal path, the adjustable path delay circuit including first and second driver circuits, the first driver circuit having a first bias adjustable drivability and the second driver circuit having a second bias adjustable drivability, the first driver circuit having an output coupled to an output of a signal driver included in the signal path, and the second driver circuit having an input coupled to the output of the signal driver included in the signal path and the second driver circuit having an output coupled to an input of the first driver circuit; and
   a bias circuit coupled to the adjustable path delay circuit and configured to provide bias signals to the first and second driver circuits to change the first and second adjustable drivability thereof responsive to changes in power provided to the signal path.

2. The apparatus of claim 1 wherein the first and second driver circuits comprise first and second inverter circuits.

3. The apparatus of claim 1 wherein the first and second inverter circuits are cross-coupled.

4. The apparatus of claim 1 wherein the bias circuit is configured to provide bias signals to the first and second driver circuits to increase drivability of the first and second driver circuits responsive to an increase in power provided to the signal path.

5. The apparatus of claim 1 wherein the bias circuit is configured to provide bias signals to the first and second driver circuits to decrease drivability of the first and second driver circuits responsive to a decrease in power provided to the signal path.

6. The apparatus of claim 1 wherein the adjustable path delay circuit is a first adjustable path delay circuit and the apparatus of claim 1 further comprises a second adjustable path delay circuit coupled to the signal path, the second adjustable path delay circuit including third and fourth driver circuits.

7. The apparatus of claim 1 wherein the first driver circuit comprises:
   an inverter circuit;
   a first transistor coupled to the inverter circuit and configured to be coupled to a power supply; and
   a second transistor coupled to the inverter circuit and configured to be coupled to a reference voltage.

8. An apparatus, comprising:
   a signal path including a plurality of signal driver circuits coupled in series, the signal path having a signal path delay; and
   a signal path delay compensation circuit coupled to the signal path, the signal path delay compensation circuit including an adjustable path delay circuit and a bias circuit, the adjustable path delay circuit including a latch circuit, the latch circuit including first and second driver circuits coupled as a latch, the first driver circuit having an output coupled to the output of a signal driver circuit of the plurality of signal driver circuits and the second driver circuit having an input coupled to the output of the signal driver circuit of the plurality of signal driver circuits, the bias circuit configured to provide bias signals to the first and second driver circuits of the adjustable path delay circuit to change a resistance to switching a latched signal level of the latch circuit responsive to changes in power.

9. The apparatus of claim 8 wherein the bias circuit is configured to provide bias signals to the latch circuit to change the resistance to switching a latched signal level of the latch circuit.

10. The apparatus of claim 9 wherein the bias circuit is configured to provide a first bias signal having an inverse relationship with changes in power and provide a second bias signal having a direct relationship with changes in power.

11. The apparatus of claim 8 wherein the bias circuit is configured to provide bias signals to the first and second driver circuits to cause the latch circuit to be more resistant to switching its latched signal level responsive to an increase in power provided to the signal path.

12. The apparatus of claim 8 wherein the bias circuit is configured to provide bias signals to the first and second driver circuits to cause the latch circuit to be less resistant to switching its latched signal level responsive to a decrease in power provided to the signal path.

13. The apparatus of claim 8 wherein the plurality of signal driver circuits comprise a plurality of inverter circuits.

14. The apparatus of claim 8 wherein the first and second driver circuits are comprise cross-coupled inverters, the inverters having a drivability that is changeable by the bias circuit.

15. An apparatus, comprising:
   a signal path having a signal path delay and configured to receive an input signal at an input and to provide an output signal at an output responsive thereto, the signal path including a plurality of signal driver circuits coupled in series, an input of a first signal driver circuit of the plurality of signal driver circuits coupled to the input of the signal path, and an output of a second signal driver circuit of the plurality of signal driver circuits coupled to the output of the signal path;
an adjustable path delay circuit having an input coupled to the input of the signal path and further having an output coupled to the output of the signal path, the adjustable path delay circuit configured to provide a mixing signal to the output of the signal path, the mixing signal having an adjustable delay relative to the input signal; and
a bias circuit configured to provide bias signals to the adjustable path delay circuit to cause the adjustable delay to change responsive to changes in power provided to the signal path.

16. The apparatus of claim 15 wherein the adjustable path delay circuit comprises an inverter having adjustable drivability.

17. The apparatus of claim 15 wherein the bias circuit is configured to cause the inverter to have increased drivability responsive to a decrease in power provided to the signal path.

18. The apparatus of claim 15 wherein the bias circuit is configured to cause the inverter to have decreased drivability responsive to an increase in power provided to the signal path.

19. The apparatus of claim 15 wherein the adjustable delay of the adjustable path delay circuit is less than the signal path delay.

20. A method, comprising:
increasing drivability of first and second cross-coupled driver circuits to increase resistance to changing signal levels at an output of a signal driver circuit responsive to an increase in power to a delay line circuit, the first driver circuit having an output coupled to the output of the signal driver circuit and the second driver circuit having an input coupled to the output of the signal driver circuit, the first driver further having an input coupled to an output of the second driver circuit; and
decreasing drivability of the first and second cross-coupled driver circuits to decrease resistance to changing signal levels at the output of the signal driver circuit responsive to a decrease in power to a delay line circuit.

21. The method of claim 20 wherein increasing the resistance to changing signal levels at the output of the signal driver circuit comprises providing bias signals to the first and second cross-coupled driver circuits to increase drivability of driver circuits, and further comprising changing voltages of the bias signals responsive to the increase in power.

22. The method of claim 20 wherein decreasing the resistance to changing signal levels at the output of the signal driver circuit comprises providing bias signals to the first and second cross-coupled driver circuits to decrease drivability of driver circuits, and further comprising changing voltages of the bias signals responsive to the decrease in power.

23. A method, comprising:
propagating a signal through a delay line circuit to provide a delayed signal, wherein the delay line includes a plurality of signal driver circuits coupled in series, a first signal driver circuit of the plurality of signal driver circuits having an input coupled to an input of the delay line and a second signal driver circuit of the plurality of signal driver circuits having an output coupled to an output of the delay line;
decreasing a transition time of a mixing signal responsive to a decrease in power provided to the delay line circuit, wherein the mixing signal is based on the signal and the mixing signal is provided by an adjustable path delay circuit to the output of the second signal driver circuit;
increasing the transition time of the mixing signal responsive to an increase in power provided to the delay line circuit; and
mixing the mixing signal with the delayed signal at the output of the second signal driver circuit to provide an output signal.

24. The method of claim 23 wherein decreasing the transition time of the mixing signal comprises increasing drivability of the adjustable path delay circuit responsive to the decrease in power.

25. The method of claim 23 wherein increasing the transition time of the mixing signal comprises decreasing drivability of the adjustable path delay circuit responsive to the increase in power.

26. The method of claim 25, further comprising delaying the signal by a delay that is less than a delay of the delay line circuit to provide the mixing signal.

* * * * *